United States Patent
Takahashi et al.

(10) Patent No.: US 8,118,640 B2
(45) Date of Patent: Feb. 21, 2012

(54) WAFER TRANSFERRING APPARATUS, POLISHING APPARATUS, AND WAFER RECEIVING METHOD

(75) Inventors: Nobuyuki Takahashi, Tokyo (JP); Tadakazu Sone, Tokyo (JP); Takuji Kobayashi, Tokyo (JP); Hiroomi Torii, Tokyo (JP)

(73) Assignee: Ebara Corporation, Tokyo (JP)

( * ) Notice: Subject to any disclaimer, the term of this patent is extended or adjusted under 35 U.S.C. 154(b) by 991 days.

(21) Appl. No.: 11/918,254

(22) PCT Filed: Apr. 20, 2006

(86) PCT No.: PCT/JP2006/308785
§ 371 (c)(1),
(2), (4) Date: Oct. 11, 2007

(87) PCT Pub. No.: WO2006/115277
PCT Pub. Date: Nov. 2, 2006

(65) Prior Publication Data
US 2009/0041563 A1 Feb. 12, 2009

(30) Foreign Application Priority Data
Apr. 21, 2005 (JP) .................................. 2005-124093

(51) Int. Cl.
*B24B 49/00* (2006.01)
(52) U.S. Cl. ................ 451/6; 451/9; 451/287; 451/334; 414/936; 414/937
(58) Field of Classification Search .................. 451/6, 9, 451/10, 11, 41, 285, 287, 334, 335, 339; 414/416.03, 744, 754, 936, 937, 941
See application file for complete search history.

(56) References Cited

U.S. PATENT DOCUMENTS

| | | | | |
|---|---|---|---|---|
| 5,344,542 A | * | 9/1994 | Maher et al. ............. | 204/298.15 |
| 5,445,486 A | * | 8/1995 | Kitayama et al. ........ | 414/416.03 |
| 5,980,194 A | * | 11/1999 | Freerks et al. ................ | 414/754 |
| 6,113,165 A | * | 9/2000 | Wen et al. ...................... | 294/1.1 |
| 6,358,126 B1 | * | 3/2002 | Jackson et al. .................. | 451/65 |

(Continued)

FOREIGN PATENT DOCUMENTS
JP 06-077169 3/1994
(Continued)

OTHER PUBLICATIONS

International Search Report mailed Aug. 8, 2006 in the International (PCT) Application No. PCT/JP2006/308785 of which the present application is the U.S. National Stage.

(Continued)

*Primary Examiner* — Eileen P. Morgan
(74) *Attorney, Agent, or Firm* — Wenderoth, Lind & Ponack, L.L.P.

(57) ABSTRACT

A wafer transferring apparatus includes a top ring for holding a wafer on a lower end surface thereof and a pusher mechanism for transferring the wafer to and from the top ring. The pusher mechanism has a wafer rest for placing the wafer thereon and is arranged to allow the wafer released from the lower end surface of the top ring to be seated on the wafer rest. The pusher mechanism also has a sensor mechanism for detecting when the wafer is properly seated on the wafer rest. The sensor mechanism is adapted to block sensor light emitted from a light-emitting device by the wafer seated on the wafer rest.

13 Claims, 10 Drawing Sheets

U.S. PATENT DOCUMENTS

| | | | |
|---|---|---|---|
| 6,578,891 B1* | 6/2003 | Suzuki et al. | 294/64.1 |
| 6,745,901 B2* | 6/2004 | Chen et al. | 206/711 |
| 6,898,487 B2* | 5/2005 | Bacchi et al. | 700/275 |
| 7,044,832 B2* | 5/2006 | Yilmaz et al. | 451/5 |
| 7,053,386 B1* | 5/2006 | Holtam et al. | 250/492.21 |
| 7,661,921 B2* | 2/2010 | Kim et al. | 414/744.5 |
| 2001/0051088 A1* | 12/2001 | Park et al. | 414/416.03 |
| 2002/0045410 A1 | 4/2002 | Sakurai et al. | |
| 2005/0078312 A1* | 4/2005 | Fukuzaki et al. | 356/399 |
| 2005/0159082 A1* | 7/2005 | Sakurai et al. | 451/11 |
| 2006/0003672 A1* | 1/2006 | Yoshida et al. | 451/5 |

FOREIGN PATENT DOCUMENTS

| | | |
|---|---|---|
| JP | 07-201952 | 8/1995 |
| JP | 08-012076 | 1/1996 |
| JP | 11-091948 | 4/1999 |
| JP | 11-116045 | 4/1999 |
| JP | 2000-031252 | 1/2000 |
| JP | 2001-068537 | 3/2001 |
| JP | 2001-135604 | 5/2001 |
| JP | 2002-016028 | 1/2002 |
| JP | 2003-188128 | 7/2003 |
| KR | 2003-0031790 | 4/2003 |
| WO | 03/087436 | 10/2003 |

OTHER PUBLICATIONS

English language machine translation of JP 06-077169 having a publication date of Mar. 18, 1994.

English language machine translation of JP 2000-031252 having a publication date of Jan. 28, 2000.

Supplementary European Search Report issued Jun. 15, 2011 in corresponding European Patent Application No. 06732391.5.

* cited by examiner

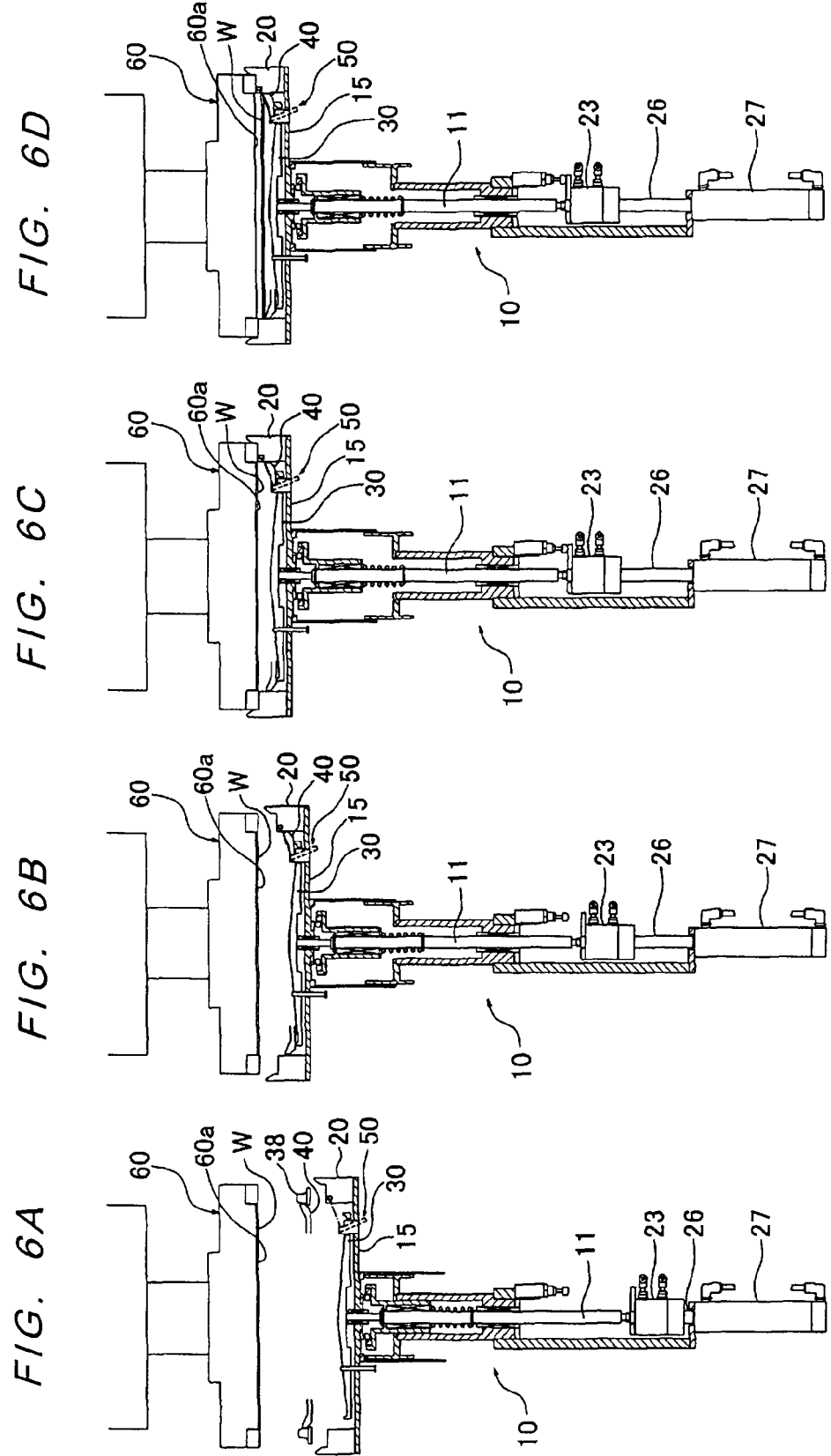

WAFER TRANSFERRING APPARATUS, POLISHING APPARATUS, AND WAFER RECEIVING METHOD

TECHNICAL FIELD

The present invention relates to a wafer transferring apparatus including a wafer holding mechanism for holding a substrate such as a semiconductor wafer (hereinafter referred to as "wafer") and a wafer transferring mechanism for transferring a wafer to and from the wafer holding mechanism, a polishing apparatus incorporating the wafer transferring apparatus, and a wafer receiving method performed by the wafer transferring apparatus.

BACKGROUND ART

Heretofore, there has been a wafer transferring apparatus including a top ring (wafer holding mechanism) for holding a wafer and a pusher mechanism (wafer transferring mechanism) for transferring a wafer to and from the top ring (see, for example, Japanese laid-open patent publication No. 2001-135604). FIGS. 1A and 1B are views showing a general structure of such a wafer transferring apparatus. FIG. 1A shows the wafer transferring apparatus immediately before a wafer W is released from a top ring 60, and FIG. 1B shows the wafer transferring apparatus when the wafer W is released from the top ring 60 and seated on a wafer rest (wafer tray) 40 of a pusher mechanism 10. The top ring 60 has a plurality of holes 65 defined in a wafer holding surface 60a on a lower end surface thereof. The holes 65 are held in fluid communication with a pressurizing and discharging source (not shown) for supplying and discharging a gas, a liquid, or a mixture thereof. The holes 65 connected to the pressurizing and discharging source provide a wafer attracting and releasing mechanism.

The pusher mechanism 10 includes a shaft 11 supporting thereon a guide stage 15 in combination with a helical spring 16 and a centering mechanism 14. Top ring guides 20 are mounted on an outer periphery of an upper surface of the guide stage 15. The wafer tray 40 disposed within the top ring guides 20 is adapted to be lifted by a push stage 30 supported on the upper end of the shaft 11. When the shaft 11 is lifted by a cylinder (not shown), the top ring guides 20 are brought into abutment against an outer periphery of a lower surface of the top ring 60, as shown in FIGS. 1A and 1B.

When the top ring 60 is supplied with a fluid (a gas, a liquid, or a mixture thereof) from the pressurizing and discharging source in FIG. 1A, the fluid 66 is ejected from the holes 65 in the wafer holding surface 60a, releasing the wafer W from the wafer holding surface 60a and seating the wafer W on the wafer tray 40, as shown in FIG. 1B. A process of releasing the wafer W from the lower end surface of the top ring 60 and seating the wafer W on the wafer tray 40 as the wafer rest of the pusher mechanism 10 will hereinafter be referred to as a wafer receiving process.

For holding the wafer W on the top ring 60, on the other hand, the shaft 11 of the pusher mechanism 10 is lifted to lift the wafer tray 40 from the position shown in FIG. 1B until the wafer W placed on the wafer tray 40 abuts against the wafer holding surface 60a of the top ring 60. The pressurizing and discharging source develops a negative pressure in the holes 65 in the wafer holding surface 60a to attract and hold the wafer W on the wafer holding surface 60a.

Heretofore, a real time required by the wafer receiving process, i.e., a time required after the wafer is actually released from the top ring 60 until it is seated on the wafer tray 40, varies from wafer to wafer and is not constant. In many cases, wafers are completely released within several seconds after start of process, while it takes 5 to 10 seconds in some cases, and takes 10 seconds or more in other cases. When a number of wafers are processed, it currently takes each wafer a different time to release. The releasing time also differs depending on the wafer processing process and the type of top ring 60, and differs from wafer to wafer even if a plurality of wafers in the same lot are processed under the same conditions.

Heretofore, however, it has been the practice to regard the reception of a wafer as being completed upon elapse of a preset time (expected releasing time) after the wafer receiving process has started, and then lower the pusher mechanism 10 and retract the top ring 60 from a position directly above the pusher mechanism 10, whereupon the wafer transferring apparatus changes to a next process. According to this operating process, however, since the wafer receiving process is not completed until the expected releasing time elapses, a wasteful latency time takes place when the wafer is actually released in a shorter time.

Heretofore, it has also been customary to forcibly end the wafer receiving process when the expected releasing time elapses, and start the next process without confirming whether the wafer is properly released from the top ring 60 or not. Therefore, if the wafer is not properly released in time, an accident such as wafer damage may occur. For preventing such an accident, it is necessary to set an expected releasing time with a sufficient margin, and begin the next process after the expected releasing time of all the wafers has elapsed. Such a practice tends to produce a wasteful latency time.

In recent years, a semiconductor fabricating apparatus, such as a polishing apparatus, needs to meet very strict requirements for increased apparatus throughputs. In particular, it is an important task to shorten the time required to perform a wafer transporting process. Therefore, it is necessary to minimize any wasteful latency time in the wafer receiving process to achieve increased apparatus throughputs. Since a reduction in the cost is also of great importance, accidental damage to expensive wafers needs to be minimized in the wafer receiving process.

SUMMARY OF THE INVENTION

The present invention has been made in view of the above problems. It is an object of the present invention to provide a wafer transferring apparatus for detecting when a wafer held by a wafer holding mechanism is properly seated on a wafer rest of a wafer transfer mechanism and changing to a next process upon confirming that the wafer is properly seated, thereby shortening a time required by a wafer receiving process and preventing an accident such as wafer damage, a polishing apparatus incorporating the wafer transferring apparatus, and a wafer receiving method performed by the wafer transferring apparatus.

In order to achieve the above object, there is provided, in accordance with a first aspect of the present invention, a wafer transferring apparatus comprising a wafer holding mechanism for holding a wafer on a lower end surface thereof and a wafer transferring mechanism for transferring a wafer to and from the wafer holding mechanism. The wafer transferring mechanism has a wafer rest for placing the wafer thereon, and is arranged to allow the wafer released from the lower end surface of the wafer holding mechanism to be seated on the wafer rest. The wafer transferring mechanism includes seating detecting means for detecting when the wafer is properly seated on the wafer seat.

According to the present invention, since the wafer transferring mechanism includes the seating detecting means for detecting when the wafer is properly seated on the wafer seat, if the wafer is released from the wafer holding mechanism and properly seated on the wafer rest in a short time, then the seating detecting means detects the proper seating of the wafer and a wafer receiving process is finished early, so that the time required by the wafer receiving process can be reduced. Therefore, the number of wafers that are processed in a unit of time is increased, so that the throughput of a polishing apparatus or the like can be increased. As the proper seating of the wafer is detected in case the wafer is not properly seated, an action to shut down the wafer transferring apparatus or the like can be taken to prevent the wafer from being damaged.

The seating detecting means may comprise a sensor mechanism for detecting the wafer which is seated on the wafer rest. In this case, it is possible to reliably detect when the wafer is properly seated on the wafer rest with a simple arrangement.

The sensor mechanism may comprise a light-emitting device for emitting light and a light-detecting device for detecting the light emitted from the light-emitting device, and the light emitted from the light-emitting device may be blocked by the wafer which is seated on the wafer rest. In this case, it is possible to reliably detect when the wafer is properly seated on the wafer rest with a simple arrangement.

The seating detecting means may detect at least three portions of the wafer which is seated on the wafer rest. In this case, if the wafer is not properly seated, e.g., if only a portion of the wafer is released from the wafer holding mechanism and the wafer is obliquely seated on the wafer rest, then such improper seating can be detected. Accordingly, an accident such as damage to the wafer is prevented from happening.

The wafer transferring mechanism may comprise a guide member for engaging an outer periphery of a lower end of the wafer holding mechanism, and a lifting and lowering mechanism for lifting and lowering the wafer rest with respect to the guide member, and the seating detecting means may be mounted on the guide member for detecting the wafer which is seated on the wafer rest. In this case, the detecting position of the seating detecting means with respect to the wafer holding mechanism for transferring the wafer is accurately aligned with the same position in each cycle of operation. As the proper seating of the wafer can be detected under the same condition, the reliability of detection of the seating is increased.

The wafer transferring apparatus may comprise warning means for issuing a warning in case the seating detecting means fails to detect when the wafer is seated or when the wafer is properly seated. In this case, the operator can be notified of the fact that the wafer is not seated or not properly seated in the wafer transferring apparatus, so that an accident such as damage to the wafer is prevented from happening.

The wafer transferring apparatus may comprise re-releasing means for trying to release the wafer from the lower end surface of the wafer holding mechanism again in case the seating detecting means fails to detect when the wafer is properly seated. In this case, the wafer can be properly seated with a higher probability, and the operational efficiency of the wafer transferring apparatus is increased.

The wafer transferring apparatus may comprise apparatus shutdown means for shutting down the wafer transferring apparatus in case the seating detecting means fails to detect when the wafer is properly seated after the re-releasing means has tried to release the wafer from the lower end surface of the wafer holding mechanism again. In this case, since the wafer transferring apparatus can be shut down in case the wafer is not properly seated, an accident such as damage to the wafer is prevented from happening.

According to a second aspect of the present invention, there is provided a polishing apparatus comprising a polishing unit including a polishing table and a top ring, for polishing a wafer by rotating the wafer held on the top ring and pressing the wafer in contact with a rotating polishing surface of the polishing table, and a cleaning unit for cleaning the wafer. The polishing apparatus incorporates the above wafer transferring apparatus in which the top ring serves as the wafer holding mechanism and the wafer transferring mechanism transfers a wafer to and from the top ring.

According to the present invention, the time required by the wafer receiving process for receiving the wafer from the top ring with the wafer transferring mechanism can be shortened to increase the throughput of the polishing apparatus.

According to a third aspect of the present invention, there is provided a method of receiving a wafer released from a wafer holding mechanism for holding the wafer on a lower end surface thereof and seated on a wafer rest of a wafer transferring mechanism. In this method, in case the wafer released from the lower end surface of the wafer holding mechanism is properly seated on a wafer rest of the wafer transferring mechanism, it is judged that the reception of the wafer is completed, and the wafer is transferred from the wafer transferring mechanism to another position.

According to the present invention, if the wafer is properly seated on the wafer rest in a short time, then the wafer receiving process is finished early and the time required by the wafer receiving process is reduced, so that the throughput of a polishing apparatus or the like can be increased.

If the wafer is not properly seated on the wafer rest of the wafer transferring mechanism, then the method may try to release the wafer from the lower end surface of the wafer holding mechanism again, and if the wafer is not properly seated on the wafer rest after trying to release the wafer again at least once, the method may cancel the reception of the wafer. As described above, if the wafer is not properly seated on the wafer rest of the wafer transferring mechanism, then the method tries to release the wafer from the lower end surface of the wafer holding mechanism again. Consequently, it is possible to release the wafer from the wafer holding mechanism and seat the wafer properly on the wafer rest of the wafer transferring apparatus with a higher probability. If the wafer is not properly seated on the wafer rest after trying to release the wafer again at least once, then the reception of the wafer is canceled. Therefore, an accident such as damage to the wafer is prevented from happening.

The above objects and other objects and advantages of the present invention will become apparent from the following description when taken in conjunction with the accompanying drawings which illustrate preferred embodiments of the present invention by way of example.

BRIEF DESCRIPTION OF DRAWINGS

FIGS. 6A through 6D are views illustrative of a process of receiving the wafer held by the top ring with the pusher mechanism;

DETAILED DESCRIPTION OF THE INVENTION

Figure 1A:
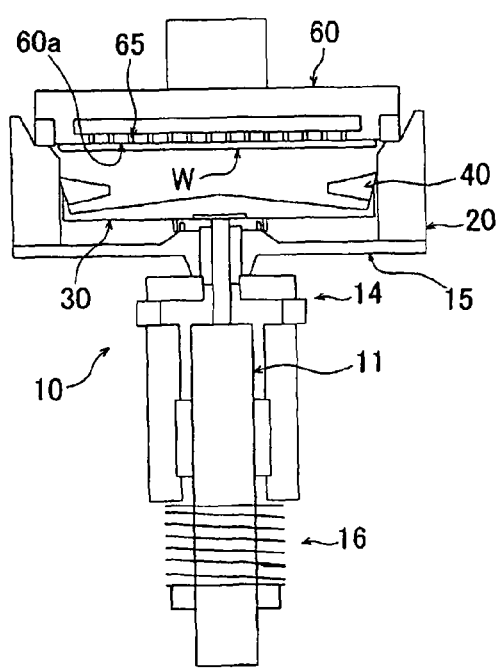
FIGS. 1A and 1B are views showing the structure of a conventional wafer transferring apparatus.
Figure 1B:
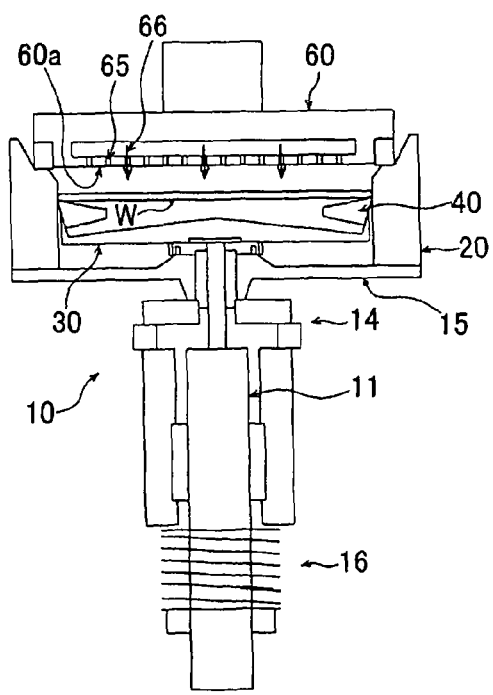

Embodiments of the present invention will be described in detail below with reference to the drawings. Those parts in the drawings and the description of the embodiments, which are identical to those of the conventional art shown in FIGS. 1A and 1B, are denoted by identical reference characters.

First Embodiment

Figure 2:
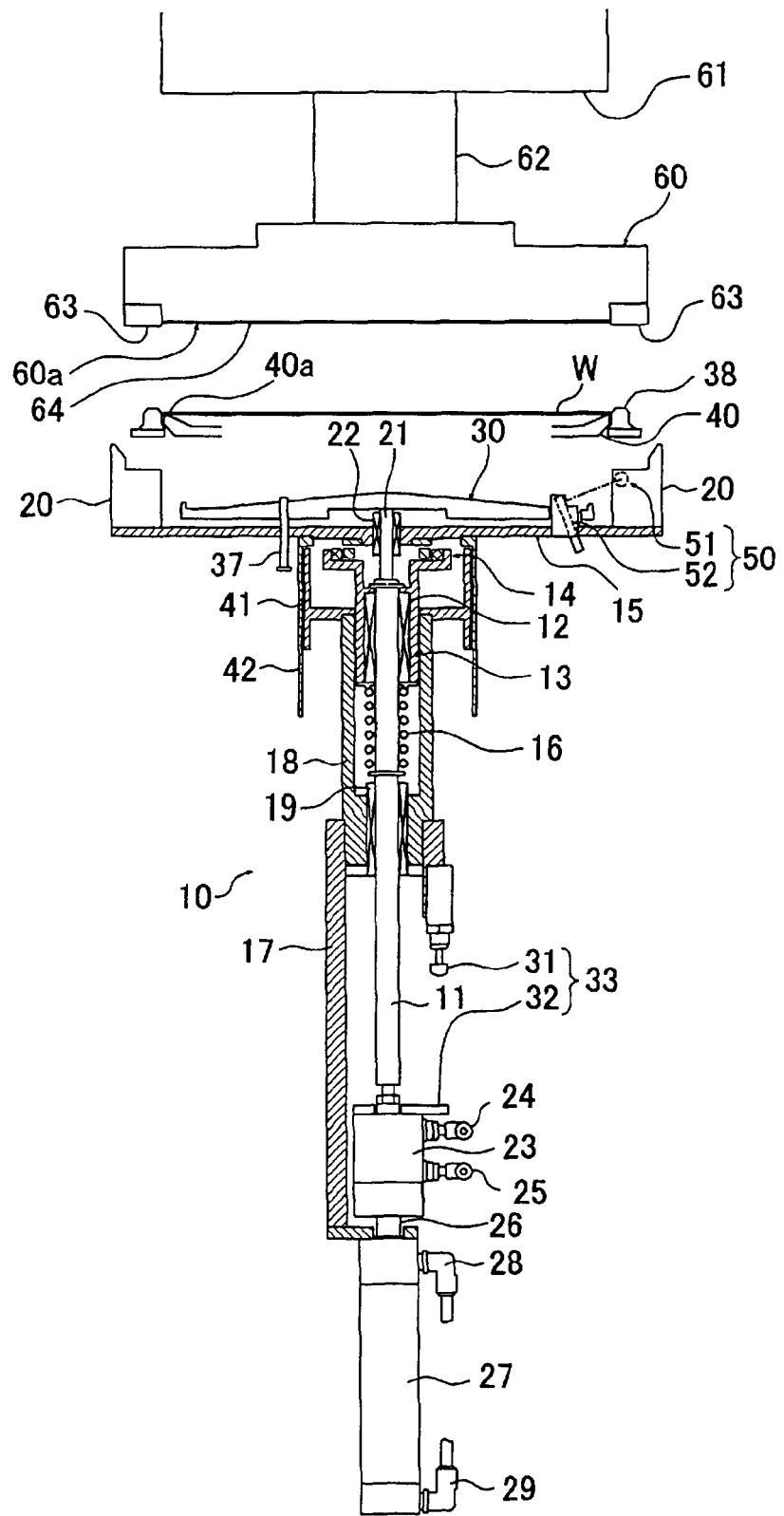
FIG. 2 is a sectional side view of a wafer transferring apparatus according to an embodiment (first embodiment) of the present invention.
Figure 3:
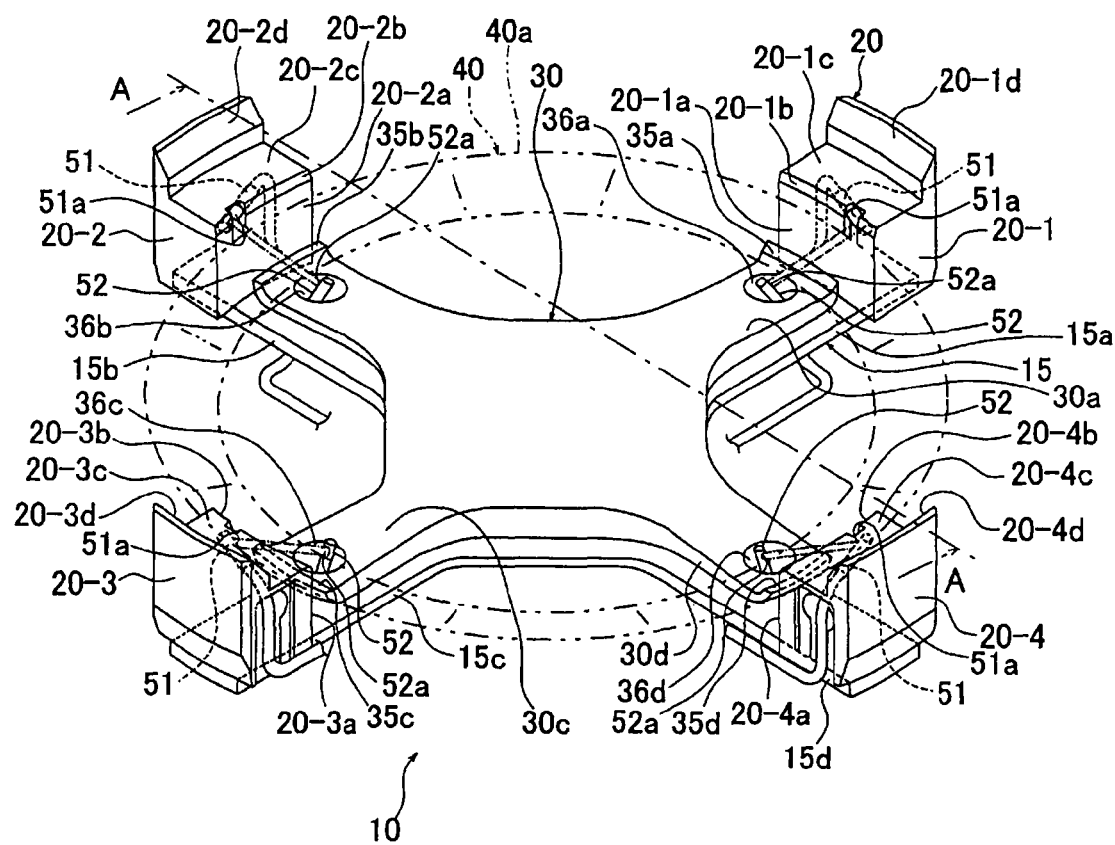
FIG. 3 is a perspective view of an upper structure of a pusher mechanism.
Figure 4:
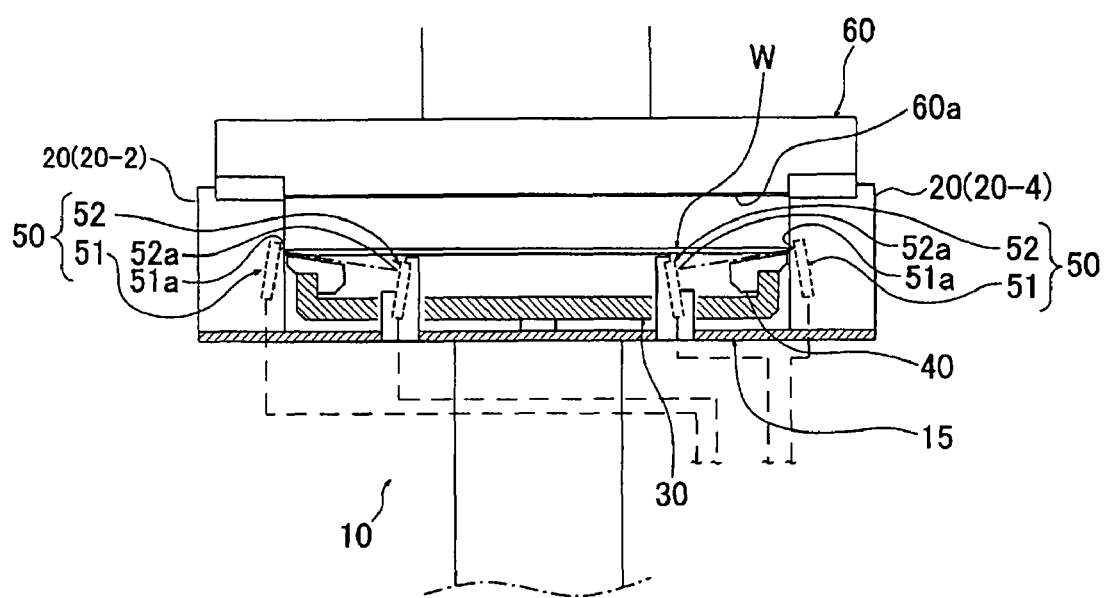
FIG. 4 is a cross-sectional view of the wafer transferring apparatus at a position corresponding to line A-A of FIG. 3.

FIG. 2 is a sectional side view of a wafer transferring apparatus according to a first embodiment of the present invention. FIG. 3 is a perspective view of an upper structure of a pusher mechanism 10 of the wafer transferring apparatus. FIG. 4 is a cross-sectional view schematically showing the pusher mechanism 10 and a top ring 60 at a position corresponding to line A-A of FIG. 3. The top ring 60 is a wafer holding mechanism for holding a wafer on its lower end surface, and the pusher mechanism 10 is a wafer transferring mechanism for transferring a wafer W to and from the top ring 60. The pusher mechanism 10 comprises a guide stage 15 supporting the top ring guides 20 which serve as guide members for engaging an outer periphery of a lower surface of the top ring 60, and a push stage 30 for pushing upwardly a wafer tray 40 having an upper surface acting as a wafer rest for placing the wafer W thereon, the guide stage 15 and the push stage 30 being mounted on an upper end of a vertical shaft 11.

Specifically, the pusher mechanism 10 includes a bearing case 13 vertically movably mounted on an upper portion of the shaft 11 by a slide bearing 12. The guide stage 15 is mounted on the bearing case 13 with a centering mechanism 14 interposed therebetween. A helical spring 16 is interposed between the bearing case 13 and the shaft 11 for normally biasing the bearing case 13 upwardly with respect to the shaft 11. The centering mechanism 14 serves as a mechanism for positioning the top ring guides 20, and is capable of moving the top ring guides 20 in horizontal directions (X-axis and Y-axis directions). A push rod 21 projects from the upper end of the shaft 11. The push rod 21 projects upwardly through a central portion of the guide stage 15, and the push stage 30 is mounted on the upper end of the push rod 21. The push rod 21 is vertically movable supported on the guide stage 15 by a slide bearing 22. The shaft 11, on the other hand, is vertically movably supported by a slide bearing 19 on a bearing case 18 mounted on a fixed member 17.

The shaft 11 has a lower end coupled to a cylinder (air cylinder) 23. The cylinder 23 causes the shaft 11 to lift and lower the push stage 30. Limit sensors 24, 25 for confirming the position of the push stage 30 as it is lifted and lowered are mounted on the cylinder 23. A shaft 26 is coupled to the lower end of the cylinder 23 and has a lower end coupled to a cylinder (air cylinder) 27 mounted on the fixed member 17.

The cylinder 27 causes the shaft 26 to lift and lower the cylinder 23, thereby lifting and lowering the guide stage 15, the top ring guides 20 and the push stage 30 in unison. Limit sensors 28, 29 for confirming the position of the shaft 26 as it is lifted and lowered are mounted on the cylinder 27. A cushioning member 31 is mounted on the lower end of the bearing case 18, and a plate-like stopper member 32 is mounted on the upper end of the cylinder 23. The cushioning member 31 and the stopper member 32 jointly make up a shock damping mechanism 33. The shock damping mechanism 33 performs vertical positioning and absorbs shocks at the time the top ring guides 20 are lifted to access the top ring 60.

As shown in FIG. 3, the guide stage 15 comprises a flat plate including a plurality of (four as shown) arms 15*a* through 15*d* projecting radially outwardly from the center thereof. The arms 15*a* through 15*d* are spaced at equal angular intervals, and the top ring guides 20 (20-1 through 20-4) are mounted on the upper surfaces of the distal end portions of the respective arms 15*a* through 15*d*. The top ring guides 20-1 through 20-4 have respective inner circumferential side surfaces 20-1*a* through 20-4*a* shaped complementarily to the outer circumferential surface of the wafer tray 40, described below, and have respective tapered surfaces 20-1*b* through 20-4*b* on upper end portions thereof for leading in the wafer W. The top ring guides 20-1 through 20-4 also have on their upper surfaces respective steps 20-1*c* through 20-4*c* for engaging the outer periphery of the lower surface of the top ring 60, and tapered surfaces 20-1*d* through 20-4*d* disposed outwardly of the steps 20-1*c* through 20-4*c* for leading in the outer periphery of the lower surface of the top ring 60.

As shown in FIG. 3, the push stage 30 comprises a flat plate, disposed above the guide stage 15, including a plurality of (four as shown) arms 30*a* through 30*d* projecting radially outwardly from the center thereof. The arms 30*a* through 30*d* are positioned directly above the respective arms 15*a* through 15*d* of the guide stage 15. The arms 30*a* through 30*d* have respective distal ends serving as lifters 35*a* through 35*d* for lifting the wafer tray 40, and have respective openings 36*a* through 36*d* defined as through holes inwardly of the lifters 35*a* through 35*d*.

The wafer tray 40 is placed on the push stage 30. The wafer tray 40 is a ring-like flat plate having an outside diameter slightly smaller than the diameter of the inner circumferential surfaces of the top ring guides 20-1 through 2-4. The wafer tray 40 has an upper surface whose outer periphery serves as a wafer rest 40*a* for placing the wafer W thereon. In FIG. 2, 38 represents a transporter for transporting the wafer tray 40 from another place horizontally to the position of the pusher mechanism 10 and transferring the wafer tray 40 onto the push stage 30. 37 represents a stroke pin for supporting the push stage 30 as it is lifted and lowered.

As shown in FIG. 2, a central sleeve 41 is fixed to the upper end of the bearing case 18, and a guide sleeve 42 is fixed to the lower end of the guide stage 15 in slidable engagement with the outer circumferential surface of the central sleeve 41. The guide sleeve 42 has a water-resistant function and a function to guide the guide stage 15.

Sensor mechanisms (optical sensors) 50 as seating detecting means are mounted on the guide stage 15 and the top ring guides 20. In this embodiment, the sensor mechanisms 50 are transmissive optical fiber sensors 50 each comprising a light-emitting device 51 and a light-detecting device 52 which are paired with each other. As shown in FIGS. 3 and 4, the light-emitting devices 51 are disposed in the top ring guides 20 (20-1 through 20-4), and the light-detecting devices 52 are disposed in the arms 15*a* through 15*d* of the guide stage 15.

The light-emitting devices 51 have light emitters 51a exposed from the inner circumferential side surfaces 20-1a through 20-4a of the top ring guides 20-1 through 20-4, and the light-detecting devices 52 have light detectors 52a exposed upwardly from the openings 36a through 36d of the push stage 30. When the wafer W is seated on the wafer rest 40a of the wafer tray 40 while the push stage 30 and the wafer tray 40 are being disposed in a wafer receiving position described below, the wafer W has its outer periphery positioned on straight lines interconnecting the light emitters 51a and the light detectors 52a, blocking sensor light from the light-emitting devices 51. The sensor mechanisms 50 can thus detect the seating of the wafer W. Conversely, the light-detecting devices 52 may be mounted on the top ring guide 20, and the light-emitting devices 51 may be mounted on the guide stage 15.

The sensor mechanisms 50 are installed respectively on the four arms 15a through 15d of the guide stage 15 for detecting four positions that are spaced by equal angular intervals around the outer periphery of the wafer W. The four sensor mechanisms 50 are installed such that their respective detecting positions are vertically aligned with each other. In this embodiment, since the four sensor mechanisms 50 detect the four locations on the outer periphery of the wafer W, they can detect when the wafer W is properly seated on the wafer rest 40a.

The state in which the wafer W is properly seated refers to a state in which the wafer W is completely released from the top ring 60 and seated wholly on the wafer rest 40a. In this state, the sensor light emitted from the light emitters 50a is blocked for all the four sensor mechanisms 50. If the sensor light is blocked by the wafer W that is properly seated, then the amount of light detected by the light detectors 52a is about 0.3% of the amount of light (maximum amount of light) detected if the sensor light is not blocked at all. A threshold value for the amount of light to differentiate the detected state before the wafer is seated and the blocked state when the wafer is properly seated may be set to about 1.5% of the maximum amount of light. If the amount of light detected by all the four sensor mechanisms 50 falls below the threshold value, then it is judged that the wafer W is properly seated. The amount of detected light and the threshold value that are set above are given by way of example only. For setting the threshold value, the actual amount of light detected when the wafer W is seated may be measured, and the amount of detected light and the threshold value for judging that the wafer W is seated may be determined appropriately.

The state in which the wafer W is not properly seated, on the other hand, refers to a state in which the wafer W sticks to the lower surface of the top ring 60 when the wafer W is to be released from the lower surface of the top ring 60, and cannot be seated on the wafer rest 40 in its entirety. Specifically, if a portion of the wafer W sticks to the lower surface of the top ring 60 and the wafer W is obliquely peeled off, only a portion of the wafer W is released from the top ring 60, and the wafer W falls obliquely, so that the wafer W is seated on only a portion of the wafer rest 40a. In this case, the sensor light is blocked for some of the four sensor mechanisms 50 (with the amount of blocked light being in excess of the threshold value), and the sensor light is not blocked at all for the remaining sensor mechanisms 50 or the amount of light detected by the remaining sensor mechanisms 50 is not sufficiently lowered and does not reach the threshold value.

For detecting when the wafer W is properly seated on the wafer rest 40a, it is desirable to detect at least three locations on the outer periphery of the wafer W. Therefore, at least three sensor mechanisms 50 may be installed in position. If three sensor mechanisms 50 are to be installed in position, then the guide stage 15 may have three arms and three top ring guides 20 may be used.

As shown in FIG. 2, the top ring 60 as the wafer holding mechanism comprises a circular plate mounted on the lower end of a rotational shaft 62 suspending from a top ring head 61. The top ring 60 has the wafer holding surface 60a on its lower end surface for attracting and holding the wafer W. A membrane (elastic membrane) 64, for abutting against the wafer W held by the top ring 60, is mounted on the wafer holding surface 60a. The membrane 64 is made of a rubber material having excellent strength and durability, such as ethylene propylene rubber (EPDM), polyurethane rubber, silicone rubber, or the like. An annular retainer ring 63 is mounted on the outer periphery of the lower surface of the top ring 60 (the outer periphery of the membrane 64).

The top ring 60 has a plurality of holes (not shown) that are open in the wafer holding surface 60a. The holes are held in fluid communication with a pressurizing and discharging source (not shown), which develops a negative pressure in the holes to attract and hold the wafer W against the wafer holding surface 60a. Clean air or a nitrogen gas, on the other hand, may be ejected from the holes to the wafer W for releasing the wafer W from the top ring 60 to fall onto wafer rest 40a of the wafer tray 40. For reliably releasing the wafer W, the ejected air or gas may be mixed with a liquid such as pure water or the like. When the wafer W is polished, clean air or a nitrogen gas may be supplied through the holes to the wafer holding surface 60a to selectively bring a given area of the wafer W into press contact with a polishing table.

The wafer transferring apparatus includes a control means (not shown), for controlling various operations of the pusher mechanism 10 and the top ring 60 and detection by the sensor mechanism 50 of the wafer W. The control means controls activation and shutdown of the pusher mechanism 10 and the top ring 60 and also controls times and counts of their various operations. The wafer transferring apparatus also includes a warning mechanism (not shown) for warning and notifying the operator if the sensor mechanism 50 does not detect when the wafer W is seated or properly seated.

Figure 5A:
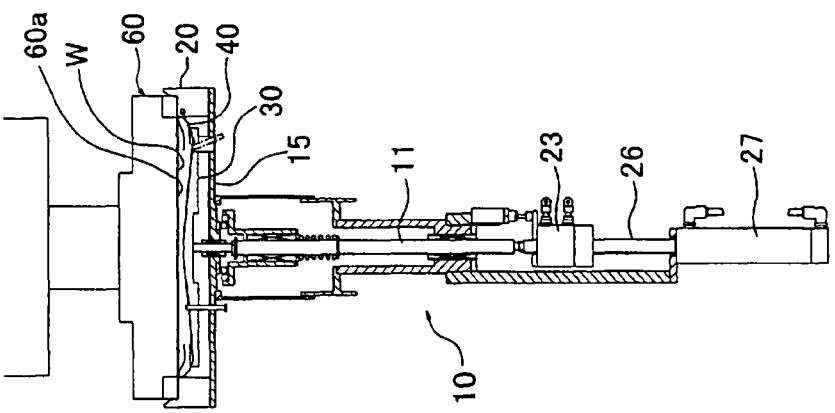
FIGS. 5A through 5D are views illustrative of a process of transferring a wafer to a top ring with a pusher mechanism.

A process of the pusher mechanism 10 of the wafer transferring apparatus for transferring the wafer to and from the top ring 60 will be described below. First, a process of transferring the wafer W placed on the wafer tray 40 to the top ring 60 will be described below with reference to FIGS. 5A through 5D. FIG. 5A shows a state before the wafer W is transferred to the top ring 60. At this time, the top ring guide 20 of the pusher mechanism 10 is disposed in a lowest position, and the push stage 30 is disposed in a lowest position. This state is referred to as a home position (HP) of the pusher mechanism 10. In the state shown in FIG. 5A, furthermore, the transporter 38 with the wafer W and the wafer tray 40 supported thereon is in the position of the pusher mechanism 10, and the top ring 60 is positioned directly above the pusher mechanism 10.

Figure 5B:
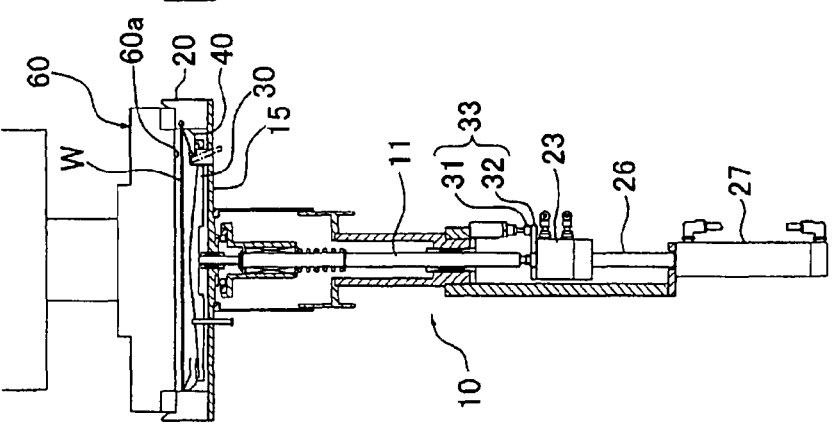
Figure 5C:
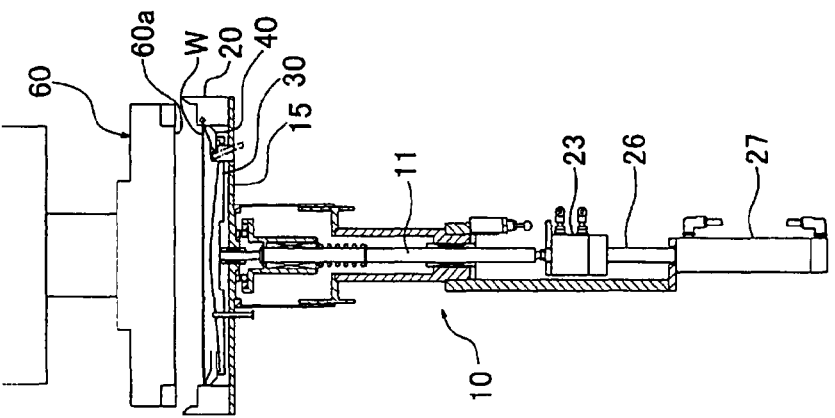
Figure 5D:
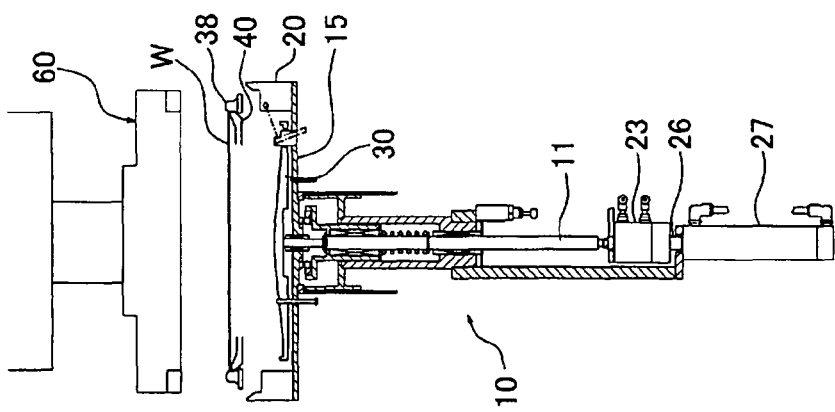

In the state shown in FIG. 5A, the cylinder 27 is actuated to push the shaft 26 upwardly. As shown in FIG. 5B, the top ring guides 20 and the push stage 30 are thus lifted in unison with each other, and the wafer tray 40 and the wafer W supported on the transporter 38 are pushed upwardly by the push stage 30. When the top ring guides 20 are brought into abutment against the outer periphery of the lower surface of the top ring 60, as shown in FIG. 5C, the shock damping mechanism 33 stops the top ring guides 20 against upward movement. When the cylinder 23 is then actuated, only the push stage 30 is lifted, as shown in FIG. 5D, until the upper surface of the wafer W placed on the wafer tray 40 abuts against the wafer holding surface 60a of the top ring 60. The position of the various parts of the pusher mechanism 10 shown in FIG. 5D will hereinafter be referred to as a wafer transferring position. Then, the pressurizing and discharging source (not shown) develops a negative pressure in the holes in the top ring 60 to attract and hold the wafer W against the wafer holding surface 60a. When the wafer W is held by the top ring 60, the various parts of the pusher mechanism 10 are returned to the home position.

A process of receiving the wafer W held by the top ring 60 with the pusher mechanism 10 will be described below with reference to FIGS. 6A through 6D. In the state shown in FIG. 6A, the various parts of the pusher mechanism 10 are in the home position (HP) in which the transporter 38 with the wafer tray 40 supported thereon is in the position of the pusher mechanism 10, and the top ring 60 holding the wafer W is positioned directly above the pusher mechanism 10. The cylinder 27 is then actuated to push the shaft 26 upwardly to lift the top ring guides 20, as shown in FIG. 6B. The push stage 30 is also lifted in unison to push upwardly the wafer tray 40 placed on the transporter 38. Then, as shown in FIG. 6C, the top ring guides 20 abut against the top ring 60. At this time, the wafer tray 40 is disposed beneath the top ring 60 and spaced a predetermined distance from the wafer holding surface 60a. The position of the various parts of the pusher mechanism 10 shown in FIG. 6C will hereinafter be referred to as a wafer receiving position.

Then, the pressurizing and discharging source (not shown) supplies a fluid (a gas, a liquid, or a mixture thereof) to the holes in the top ring 60, which eject the fluid toward the upper surface of the wafer W held in close contact with the wafer holding surface 60a of the top ring 60. This action will hereinafter be referred to as an action of the top ring 60 to release the wafer W. The action of the top ring 60 to release the wafer W is repeated a preset number of times. When the wafer W is properly released from the top ring 60 during this time, the wafer W drops and is seated on the wafer rest 40a (see FIG. 3) of the wafer tray 40, as shown in FIG. 6D. Since the sensor light emitted from the light-emitting devices 51 of the sensor mechanisms 50 is blocked by the wafer W, the sensor mechanisms 50 detect the seating of the wafer W. If the wafer W is properly seated, then all the sensor mechanisms 50 detect the wafer W. If the wafer W drops obliquely and only a portion thereof is seated, then some of the four sensor mechanisms 50 detect the seating of the wafer W. Accordingly, the sensor mechanisms 50 can detect not only when the wafer W is seated, but also when the wafer W is properly seated.

Figure 7:
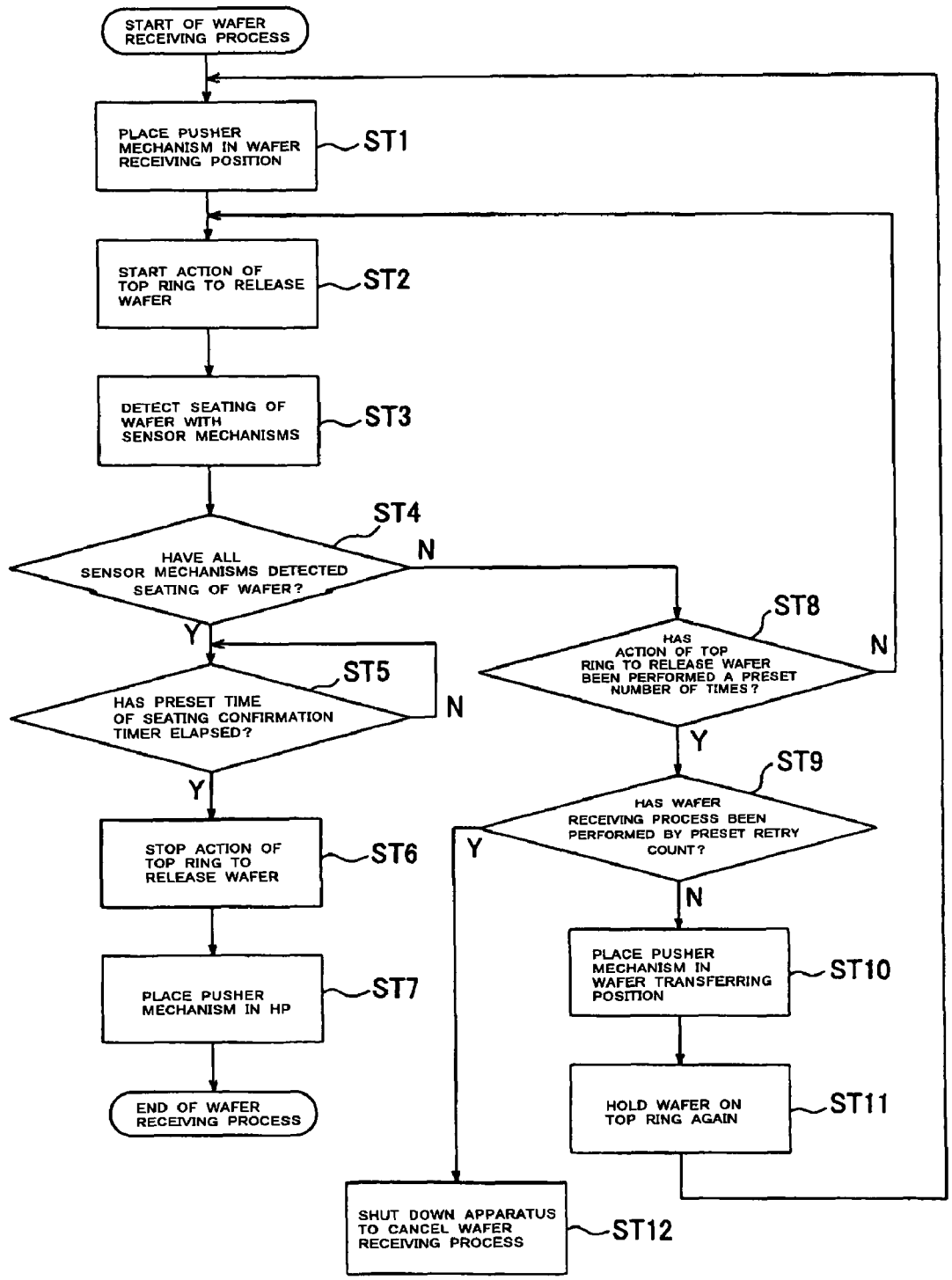
FIG. 7 is a flowchart showing the details of an operation sequence of the wafer transferring apparatus.

Details of operation of the pusher mechanism 10 and the top ring 60 in the wafer receiving process will be described below with reference to a flowchart shown in FIG. 7. After the wafer receiving process has started, the various parts of the pusher mechanism 10 are placed in the wafer receiving position (step ST1). Then, the action of the top ring 60 to release the wafer starts (step ST2), and the sensor mechanisms 50 detect the wafer W seated on the wafer tray 40 (step. ST3). As a result, if all the sensor mechanisms 50 detect the seating of the wafer W in step ST4, then it is judged that the wafer W is properly seated. After the preset time of a seating confirmation timer has elapsed (step ST5), the action of the top ring 60 to release the wafer is put to an end (step ST6). Thereafter, the various parts of the pusher mechanism 10 are returned to the home position (step ST7). The wafer receiving process is now finished.

If any one of the sensor mechanisms 50 fails to detect the seating of the wafer W in step ST4, on the other hand, then it is judged that the wafer W is not properly seated, and it is confirmed whether the action of the top ring 60 to release the wafer has been performed a preset number of times (step ST8). As a result, if the action of the top ring 60 to release the wafer has not been performed a preset number of times, then the action of the top ring 60 to release the wafer is performed again in order to try to release the wafer W (step ST2). If the action of the top ring 60 to release the wafer has been performed a preset number of times in step ST8, then it is determined whether the number of times that the wafer receiving process has been performed has reached a preset retry count (step ST9). If the number of times that the wafer receiving process has been performed has not reached a preset retry count, then the various parts of the pusher mechanism 10 are placed in the wafer transferring position again (step ST10), and a negative pressure is developed in the holes in the top ring 60 to cause the wafer holding surface 60a to hold the wafer W again (step ST11). Thereafter, the various parts of the pusher mechanism 10 are placed in the wafer receiving position (step ST1), and the wafer receiving process is performed again from the outset. Consequently, even if the wafer W is not properly seated, i.e., if only a portion of the wafer W is seated, in the previous wafer receiving process, the wafer receiving process can be performed again after the wafer W has been properly held on the top ring 60 again.

If the wafer receiving process has been performed has reached a preset retry count in step ST9, on the other hand, then since various parts of the pusher mechanism 10 and the top ring 60 may possibly be malfunctioning or failing to operate, the wafer receiving apparatus is shut down to cancel the wafer receiving process (step ST12). On this occasion, the warning mechanism may issue a warning to indicate to the operator that the wafer has not been properly received.

Inasmuch as the wafer receiving process is finished after the seating of the wafer W is detected, if the wafer W is released from the top ring 60 and properly seated on the wafer tray 40 in a short time, then the wafer receiving process can be finished early and hence the time required by the wafer receiving process can be reduced. Therefore, the number of wafers W that are processed in a unit of time can be increased for an increased apparatus throughput. If the wafer W is not properly seated, then the action of the top ring 60 to release the wafer is performed again in order to try to release the wafer W. Accordingly, the wafer W can be properly seated with a higher probability, and the operational efficiency of the wafer transferring apparatus can be increased. If the wafer W is not properly seated after the action of the top ring 60 to release the wafer is performed again, then the wafer receiving process is performed again from the outset. Therefore, the wafer W can reliably be seated. If the wafer W is not properly seated finally, then the wafer transferring apparatus is shut down to forestall an accident such as damage to the wafer W.

Second Embodiment

Figure 8:
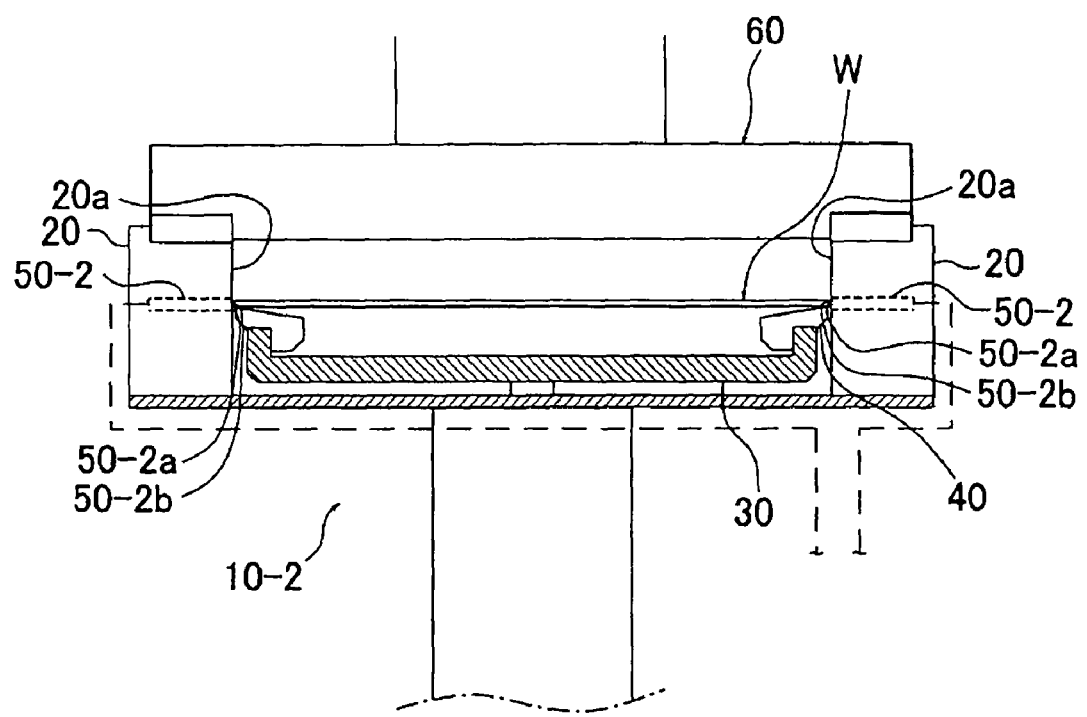
FIG. 8 is a side view schematically showing a wafer transferring apparatus according to another embodiment (second embodiment) of the present invention.

FIG. 8 is a side view schematically showing a wafer transferring apparatus according to a second embodiment of the present invention. The wafer transferring apparatus according to the present embodiment shares structural details other than illustrated and their operation with the wafer transferring apparatus according to the first embodiment. Those parts of the illustrated details, which are identical to those of the first embodiment, are denoted by identical reference characters, and will not be described in detail below. The wafer transferring apparatus according to this embodiment includes a pusher mechanism 10-2 instead of the pusher mechanism 10 according to the first embodiment. The pusher mechanism 10-2 is structurally different from the pusher mechanism 10 in that it includes sensor mechanisms 50-2 instead of the sensor mechanisms 50. The sensor mechanisms 50-2 are reflective sensors each comprising a light-emitting device 50-2*a* and a light-detecting device 50-2*b* which are disposed on one surface, and are mounted in the top ring guides 20. The light-emitting devices 50-2*a* and the light-detecting devices 50-2*b* of the sensor mechanisms 50-2 are exposed from the inner circumferential side surfaces 20*a* (20-1*a* through 20-4*a*) of the top ring guides 20. The light-emitting devices 50-2*a* apply sensor light to the side surface (outer circumferential edge surfaces) of the wafer W seated on the wafer tray 40, and the light-detecting devices 50-2*b* detect light reflected from the side surface of the wafer W to detect the seating of the wafer W. In this embodiment, the plural (three or more) sensor mechanisms 50-2 are capable of detecting when the wafer W is properly seated on the wafer rest 40*a*.

Third Embodiment

Figure 9:
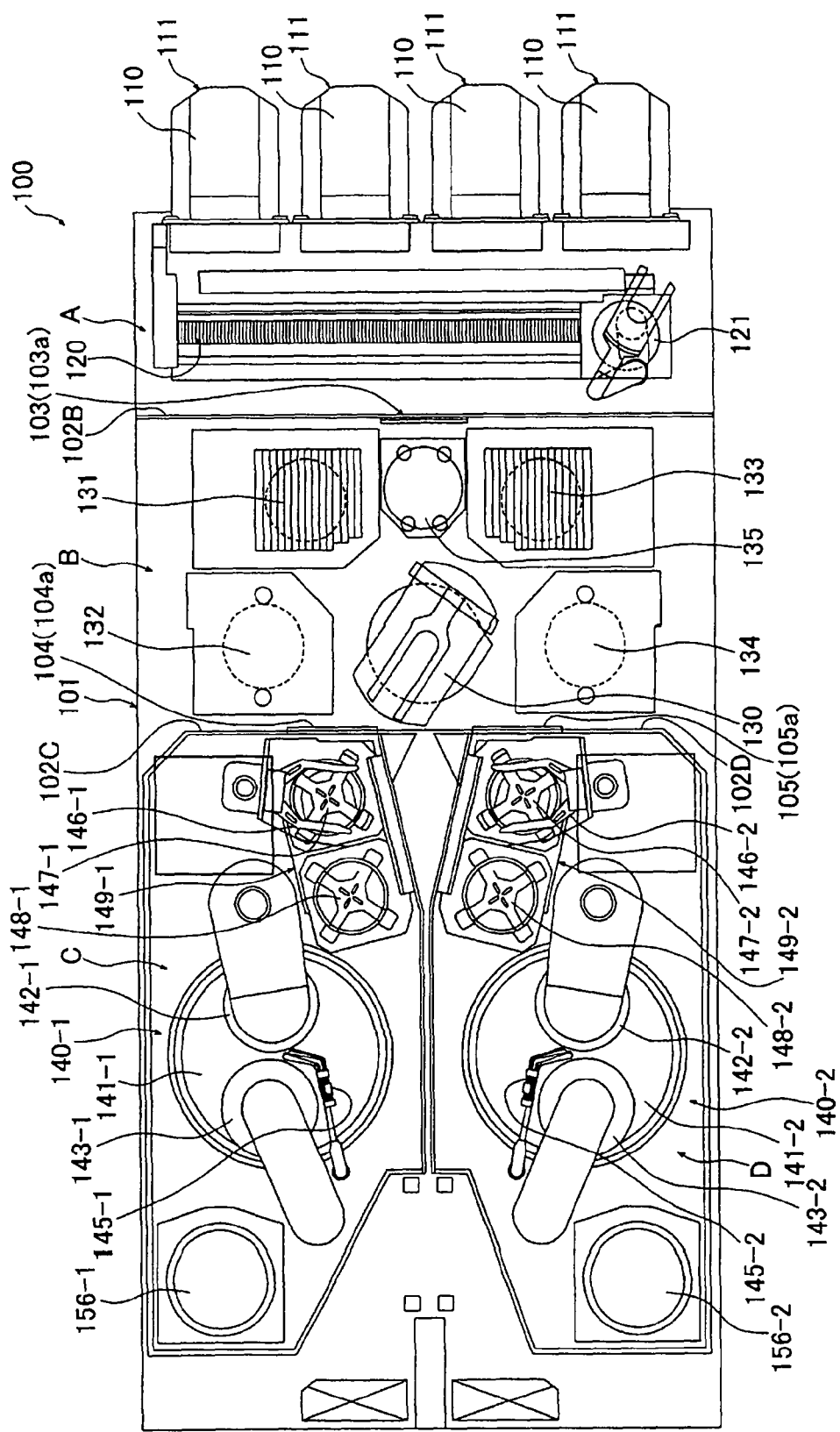
FIG. 9 is a view showing a planar arrangement of a polishing apparatus incorporating the wafer transferring apparatus.

FIG. 9 is a view showing a planar arrangement of a polishing apparatus 100 incorporating the wafer transferring apparatus according to the first or second embodiment described above. The polishing apparatus 100 includes a housing 101 housing therein the apparatus in its entirety and a plurality of partition walls 102 disposed in the housing 101. The space in the housing 101 is divided by the partition walls 102 into a feeding area A, a cleaning area B, a polishing area C, and a polishing area D.

A plurality of (four as shown) loading/unloading stages 111 for placing thereon wafer cassettes 110 each with a number of wafers housed therein are disposed parallel to each other outside of the feeding area A. A straight travel rail 120 is laid in the feeding area A, and a transport robot (first transport robot) 121 is placed in the feeding area A for movement on the travel rail 120. A transport robot (second transport robot) 130 is disposed centrally in the cleaning area B that is disposed next to the feeding area A. Four cleaning machines 131, 132, 133, 134 are disposed in surrounding relation to the transport robot 130, with a wafer rest 135 being disposed between the cleaning machines 131, 133. The second transport robot 130 has a hand that can reach the cleaning machines 131 through 134 and the wafer rest 135. Of the four cleaning machines 131 through 134, the two cleaning machines 131, 133 are disposed adjacent to the travel rail 120. The first transport robot 121 has a hand that can reach the wafer cassettes 110, the cleaning machines 131, 133, and the wafer rest 135.

A partition wall 102B is disposed between the feeding area A and the cleaning area B for separating the levels of cleanliness in these areas from each other. The partition wall 102B has an opening 103 defined therein for allowing wafers to be fed between the areas. A shutter 103*a* is disposed in the opening 103. The air pressure in the cleaning area B is adjusted to an air pressure lower than the air pressure in the feeding area A.

The two polishing areas C, D are defined adjacent to the cleaning area B. The polishing areas C, D are separated from the cleaning area B by partition walls 102C, 102D. The polishing areas C, D house therein respective polishing units 140-1, 140-2 made up of structural parts of the same type which are symmetrically arranged with respect to a central line (not shown) therebetween. The polishing units 140-1, 140-2 have respective polishing tables 141-1, 141-2 disposed at a substantially central position, respective top rings 142-1, 142-2 for holding wafers W and pressing the wafers W into contact with the polishing surfaces of the polishing tables 141-1, 141-2, and respective dressers 143-1, 143-2 for dressing the polishing surfaces of the polishing tables 141-1, 141-2, the top rings 142-1, 142-2 for and the dressers 143-1, 143-2 being disposed around the respective polishing tables 141-1, 141-2. Abrasive solution nozzles 145-1, 145-2, for supplying a polishing abrasive solution, are disposed over the respective polishing tables 141-1, 141-2.

The partition walls 102C, 102D have respective openings 104, 105 defined therein for feeding wafers therethrough. Shutters 104*a*, 105*a* are disposed respectively in the openings 104, 105. Reversing machines 146-1, 146-2, for holding and reversing wafers, are disposed in respective positions in the polishing areas C, D that can be reached by the hand of the second transport robot 130.

Figure 10:
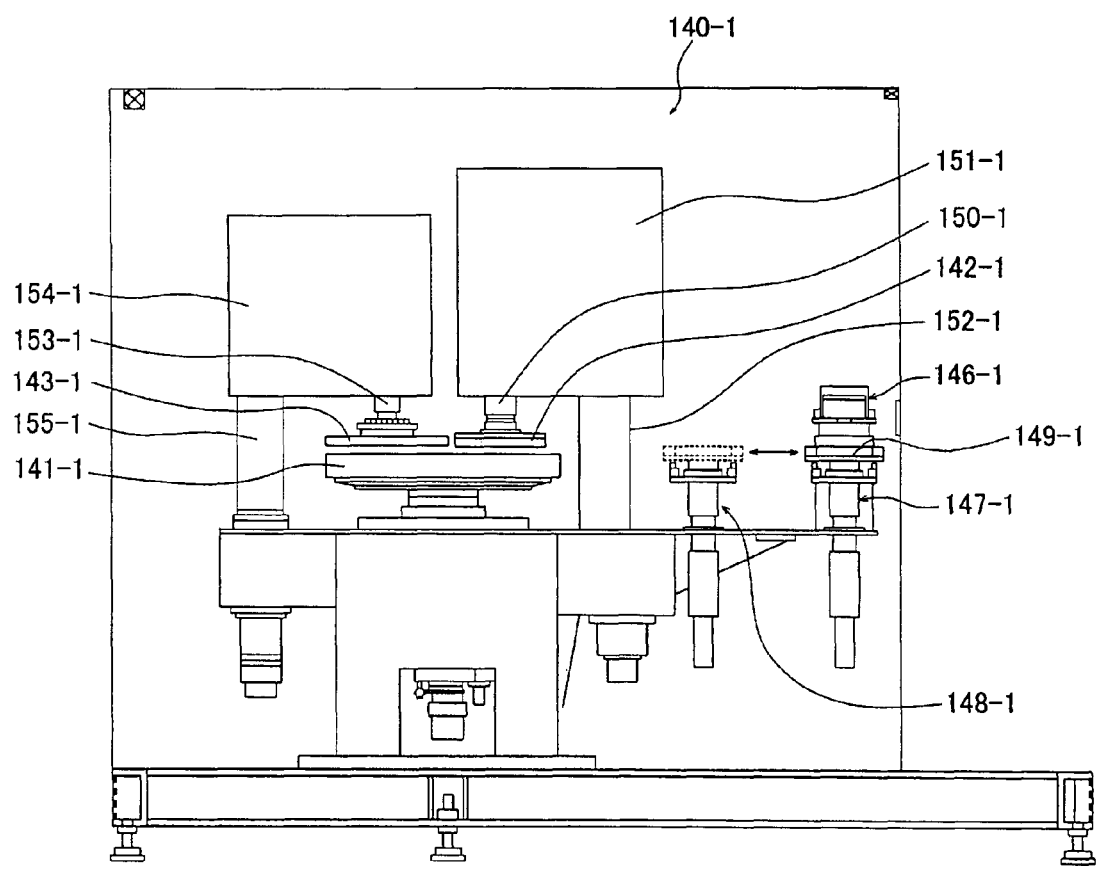
FIG. 10 is a side view schematically showing the layout of various devices of a polishing unit of the polishing apparatus.

FIG. 10 is a side view schematically showing the layout of various devices of the polishing unit 140-1. Though the polishing unit 140-1 is described below, the polishing unit 140-2 shares its structural details with the polishing unit 140-1. As shown in FIGS. 9 and 10, a lifter mechanism 147-1 is disposed beneath the reversing machine 146-1, and a pusher mechanism 148-1 serving as a wafer transferring mechanism is disposed in a position adjacent to the lifter mechanism 147-1. A linear transporter 149-1 is disposed as a transport mechanism linearly movable between the position of the pusher mechanism 148-*a* and the lifter mechanism 147-1.

The top ring 142-1 is suspended from a top ring head 151-1 by a rotational shaft 150-1. The top ring head 151-1 is supported on a swing shaft 152-1 that can be positioned. The top ring 142-1 is swingable between a position above the polishing table 141-1 and a position above the pusher mechanism 148-1. The dresser 143-1 is suspended from a dresser head 154-1 by a rotational shaft 153-1. The dresser head 154-1 is supported on a swing shaft 155-1 that can be positioned. The dresser 143-1 is swingable between a dresser cleaner 156-1 and a dressing position above the polishing table 141-1.

In this polishing apparatus 100, the top ring 60 and the pusher mechanism 10 or 10-2 according to the first or second embodiment of the present invention are used as the top rings 142-1, 142-2 and the pusher mechanisms 148-1, 148-2. The linear transporters 149-1, 149-2 correspond to the transporter 38.

A polishing process performed by the polishing apparatus 100 thus constructed will briefly be described below. When a wafer cassette 110 with wafers housed therein is placed on a loading/unloading stage 111, the first transport robot 121 takes a wafer from the wafer cassette 110 and transports the wafer to the wafer rest 135. The second transport robot 130 takes the wafer from the wafer rest 135 and transfers the wafer to the reversing machine 146-1 or 146-2. The reversing machine 146-1 or 146-2 reverses the received wafer. The wafer is then transferred onto the wafer tray 40 (see FIG. 2) placed on the linear transporter 149-1 or 149-2 by the lifter mechanism 147-1 or 147-2. Then, the linear transporter 149-1 or 149-2 moves from the position of the lifter mechanism 147-1 or 147-2 to the position of the pusher mechanism 148-1 or 148-2. Thereafter, the operation shown and described with reference to FIGS. 5A through 5D is performed between the pusher mechanism 148-1 or 148-2 (pusher mechanism 10) and the top ring 142-1 or 142-2 (top ring 60) to transfer the wafer W to the top ring 142-1 or 142-2 and hold the wafer W on the top ring 142-1 or 142-2.

The top ring 142-1 or 142-2 with the wafer attracted and held thereby swings to the position above the polishing table 141-1 or 141-2. The top ring 142-1 or 142-2 is then rotated to rotate the wafer, and the polishing table 141-1 or 141-2 is rotated. While the polishing abrasive solution is being supplied from the abrasive solution nozzle 145-1 or 145-2, the wafer is polished by being pressed against the polishing surface of the polishing table 141-1 or 141-2.

Upon completion of the polishing of the wafer, the top ring 142-1 or 142-2 is moved from the position above the polishing table 141-1 or 141-2 to the position directly above the pusher mechanism 148-1 or 148-2. The operation shown and described with reference to FIGS. 6A through 6D and 7 is performed between the top ring 142-1 or 142-2 (top ring 60) and the pusher mechanism 148-1 or 148-2 (pusher mechanism 10) to release the wafer W from the top ring 142-1 or 142-2 and to place the wafer W on the wafer try 40. Thereafter, when the wafer tray 40 with the wafer W placed thereon is put on the linear transporter 149-1 or 149-2, the linear transporter 149-1 or 149-2 is moved from the position of the pusher mechanism 148-1 or 148-2 to the position of the lifter mechanism 147-1 or 147-2. The lifter mechanism 147-1 or 147-2 transfers the wafer W to the reversing machine 146-1 or 146-2, where the wafer W is reversed. Thereafter, the wafer W is transferred to the second transport robot 130. The second transport robot 130 transports the received wafer W to either one of the cleaning machines 131 through 134, where the wafer W is cleaned. If necessary, the wafer, which has been cleaned by the cleaning machines 131 through 134, is transported by the second transport robot 130 to any other one of the cleaning machines 131 through 134, where a secondary cleaning and drying process is performed. The cleaned and dried wafer is returned to the source wafer cassette 110 by the first transport robot 121. Since the polishing apparatus 100 has the two polishing units 140-1, 140-2 of the identical structure, the polishing apparatus 100 is capable of performing parallel processing operation for simultaneously polishing different wafers with the polishing units 140-1, 140-2.

While the embodiments of the present invention have been described above, the present invention is not limited to the above embodiments, but various modifications may be made within the scope of claims and the scope of the technical idea described in the specification and drawings. Any shapes, structures, and materials that are not directly referred to in the specification and drawings fall within the technical idea of the present invention insofar as they provide operation and advantages of the present invention.

For example, the sensor mechanisms 50 and the sensor mechanisms 50-2 according to the above embodiments are examples of the seating detecting means, and the means for detecting the seating of a wafer is not limited to the optical sensor mechanisms. Other seating detecting means include, for example, a pressure detecting mechanism for detecting a pressure that is applied to a wafer rest (wafer rest surface) by a seated wafer and a switch mechanism which operates when a wafer is seated on a wafer rest.

In the above embodiments, the seating detecting means is mounted in the pusher mechanism as the wafer transferring mechanism. Alternatively, a wafer release detecting mechanism for detecting the release of a wafer may be mounted in the top ring as a means for detecting when a wafer is properly released from the top ring as the wafer holding mechanism and seated on the pusher mechanism. The wafer release detecting mechanism may comprise an optical sensor mechanism or a mechanism for measuring a negative pressure developed in the holes in the top ring to attract and hold a wafer and detecting when the wafer is released from the top ring based on a change in the pressure.

The polishing apparatus 100 is an example of a polishing apparatus incorporating the wafer transferring apparatus according to the first or second embodiment. Insofar as the wafer transferring apparatus includes the pusher mechanism 10 or 10-2 and the top ring 60 for transferring wafers between the pusher mechanism 10 or 10-2 and the top ring 60, the types, numbers, and layout of the other structural details of the polishing apparatus according to the present invention are not limited to the above embodiments.

INDUSTRIAL APPLICABILITY

The present invention can appropriately be used for a wafer transferring apparatus comprising a wafer holding mechanism for holding a substrate such as a semiconductor wafer or the like and a wafer transferring mechanism for transferring a wafer to and from the wafer holding mechanism.

The invention claimed is:

1. A wafer transferring apparatus comprising:
 a wafer holding mechanism for holding a wafer on a lower end surface thereof; and
 a wafer transferring mechanism for transferring a wafer to and from the wafer holding mechanism;
 wherein the wafer transferring mechanism includes a wafer rest for placing the wafer thereon, and is arranged to allow the wafer released from the lower end surface of the wafer holding mechanism to be seated on the wafer rest, and
 wherein the wafer transferring mechanism includes at least three sensor mechanisms for detecting when the wafer is properly seated on the wafer rest, each of the sensor mechanisms comprising a light-emitting device for emitting light and a light-detecting device for detecting the light emitted from the light-emitting device, and each of the light-emitting devices being installed at one of an outside and an inside of an outer periphery of the wafer seated on the wafer rest and each of the light-detecting devices being installed at another of the outside and the inside of the outer periphery of the wafer seated on the wafer rest such that the light emitted from each of the light-emitting devices is blocked by the outer periphery of the wafer when the wafer is properly seated on the wafer rest.

2. A wafer transferring apparatus according to claim 1,
 wherein the wafer transferring mechanism includes a plurality of guide members for engaging an outer periphery of a lower end of the wafer holding mechanism, a guide stage having arms that support the guide members thereon, and a lifting and lowering mechanism for lifting and lowering the wafer rest with respect to the guide members, and
 wherein, for each of the sensor mechanisms, one of the light-emitting device and the light-detecting device is installed on one of the guide members, and another of the light-emitting device and the light-detecting device is installed on one of the arms of the guide stage.

3. A polishing apparatus comprising:
 a polishing unit including a polishing table and a top ring, for polishing a wafer by rotating the wafer held by the top ring and pressing the wafer in contact with a rotating polishing surface of the polishing table; and
 a cleaning unit for cleaning the wafer,
 wherein the polishing apparatus includes a wafer transferring apparatus according to claim 2, in which the top ring is the wafer holding mechanism and the wafer transferring mechanism transfers the wafer to and from the top ring.

4. A wafer transferring apparatus according to claim 1, further comprising warning means for issuing a warning in case at least one of the sensor mechanisms fails to detect that the wafer is seated or that the wafer is properly seated.

5. A polishing apparatus comprising:
a polishing unit including a polishing table and a top ring, for polishing a wafer by rotating the wafer held by the top ring and pressing the wafer in contact with a rotating polishing surface of the polishing table; and
a cleaning unit for cleaning the wafer,
wherein the polishing apparatus includes a wafer transferring apparatus according to claim 4, in which the top ring is the wafer holding mechanism and the wafer transferring mechanism transfers the wafer to and from the top ring.

6. A wafer transferring apparatus according to claim 1, further comprising re-releasing means for trying to release the wafer from the lower end surface of the wafer holding mechanism again in case at least one of the sensor mechanisms fails to detect that the wafer is properly seated.

7. A polishing apparatus comprising:
a polishing unit including a polishing table and a top ring, for polishing a wafer by rotating the wafer held by the top ring and pressing the wafer in contact with a rotating polishing surface of the polishing table; and
a cleaning unit for cleaning the wafer,
wherein the polishing apparatus includes a wafer transferring apparatus according to claim 6, in which the top ring is the wafer holding mechanism and the wafer transferring mechanism transfers the wafer to and from the top ring.

8. A wafer transferring apparatus according to claim 6, further comprising apparatus shutdown means for shutting down the wafer transferring apparatus in case at least one of the sensor mechanisms fails to detect that the wafer is properly seated after the re-releasing means has tried to release the wafer from the lower end surface of the wafer holding mechanism again.

9. A polishing apparatus comprising:
a polishing unit including a polishing table and a top ring, for polishing a wafer by rotating the wafer held by the top ring and pressing the wafer in contact with a rotating polishing surface of the polishing table; and
a cleaning unit for cleaning the wafer,
wherein the polishing apparatus includes a wafer transferring apparatus according to claim 8, in which the top ring is the wafer holding mechanism and the wafer transferring mechanism transfers the wafer to and from the top ring.

10. A polishing apparatus comprising:
a polishing unit including a polishing table and a top ring, for polishing a wafer by rotating the wafer held by the top ring and pressing the wafer in contact with a rotating polishing surface of the polishing table; and
a cleaning unit for cleaning the wafer,
wherein the polishing apparatus includes a wafer transferring apparatus according to claim 1, in which the top ring is the wafer holding mechanism and the wafer transferring mechanism transfers the wafer to and from the top ring.

11. A wafer transferring apparatus according to claim 1, wherein the sensor mechanisms are installed such that their respective measuring positions are vertically aligned with each other.

12. A method of receiving a wafer, the method comprising:
releasing the wafer from a wafer holding mechanism holding the wafer on a lower end surface thereof;
receiving the wafer from the wafer holding mechanism and seating the wafer on a wafer rest of a wafer transferring mechanism;
judging that the receiving of the wafer is completed using at least three sensor mechanisms included on the wafer transferring mechanism, each of the sensor mechanisms including a light-emitting device for emitting light and a light-detecting device for detecting the light emitting from the light-emitting device, and each of the light-emitting devices being installed at one of an outside and an inside of an outer periphery of the wafer seated on the wafer rest and each of the light-detecting devices being installed at another of the outside and the inside of the outer periphery of the wafer seated on the wafer rest such that the light emitted from each of the light-emitting devices is blocked by the outer periphery of the wafer when the wafer is properly seated on the wafer rest; and
transferring the wafer from the wafer transferring mechanism to another position in case the wafer released from the lower end surface of the wafer holding mechanism is properly seated on the wafer rest of the wafer transferring mechanism, or trying the releasing of the wafer from the lower end surface of the wafer holding mechanism again in case the wafer is not properly seated on the wafer rest of the wafer transferring mechanism, wherein the judging comprises:
emitting the lights from the light-emitting devices; and
judging that the wafer released from the lower end surface of the wafer holding mechanism is properly seated on the wafer rest of the wafer transferring mechanism when none of the lights emitted from the light-emitting devices are detected by the light-detecting devices.

13. A method of receiving a wafer according to claim 12, comprising:
canceling the receiving of the wafer in case the wafer is not properly seated on the wafer rest after the trying of the releasing of the wafer again at least once.

* * * * *